United States Patent [19]
Pence, IV

[11] Patent Number: 5,285,018
[45] Date of Patent: Feb. 8, 1994

[54] POWER AND SIGNAL DISTRIBUTION IN ELECTRONIC PACKAGING

[75] Inventor: William E. Pence, IV, Tarrytown, N.Y.

[73] Assignee: International Business Machines Corporation, Armonk, N.Y.

[21] Appl. No.: 955,950

[22] Filed: Oct. 2, 1992

[51] Int. Cl.⁵ .............................. H01R 9/09
[52] U.S. Cl. ................... 174/261; 174/255; 361/794
[58] Field of Search ............... 174/250, 254, 255, 260, 174/261, 262; 361/398, 400, 414, 416; 333/1

[56] References Cited

U.S. PATENT DOCUMENTS

| | | | |
|---|---|---|---|
| 4,490,690 | 12/1984 | Suzuki | 333/1 |
| 4,685,033 | 8/1987 | Inoue | 361/414 |
| 4,710,854 | 12/1987 | Yamada et al. | 361/414 |
| 4,811,082 | 3/1989 | Jacobs et al. | 174/260 |
| 4,847,732 | 7/1989 | Stopper et al. | 361/395 |
| 4,855,537 | 8/1989 | Nakai et al. | 174/250 |
| 4,859,806 | 8/1989 | Smith | 174/261 |
| 4,866,507 | 9/1989 | Jacobs et al. | 257/659 |
| 5,003,273 | 3/1991 | Oppenberg | 333/1 |
| 5,028,983 | 7/1991 | Bickford et al. | 257/668 |

FOREIGN PATENT DOCUMENTS 2909167 9/1980 Fed. Rep. of Germany.

Primary Examiner—Leo P. Picard
Assistant Examiner—L. Thomas
Attorney, Agent, or Firm—Daniel P. Morris; Alvin J. Riddles

[57] ABSTRACT

A controlled impedance power and distribution network wherein -x- and -y- direction planes of interpositioned power and signal conductors with a dielectric layer between planes and separating each plane from a ground plane are assembled. The network provides the ability to distribute many power levels with all power and signal conductors electrically referenced to ground along their length and each signal conductor also electrically referenced to its respective power level along its length. The network is of particular advantage in the TFM technology in distributing multiple power levels with fewer layers.

13 Claims, 2 Drawing Sheets

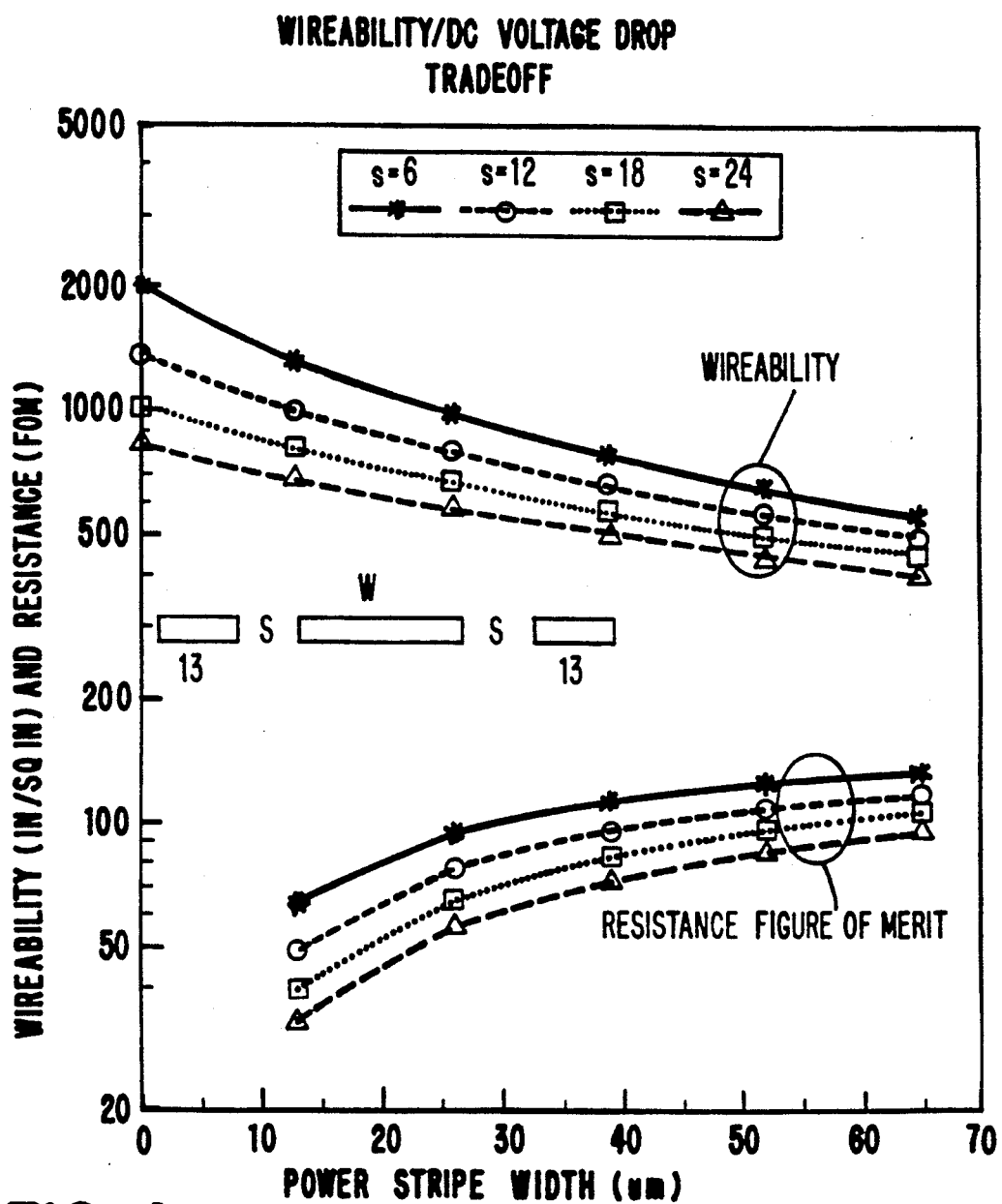
FIG. 4
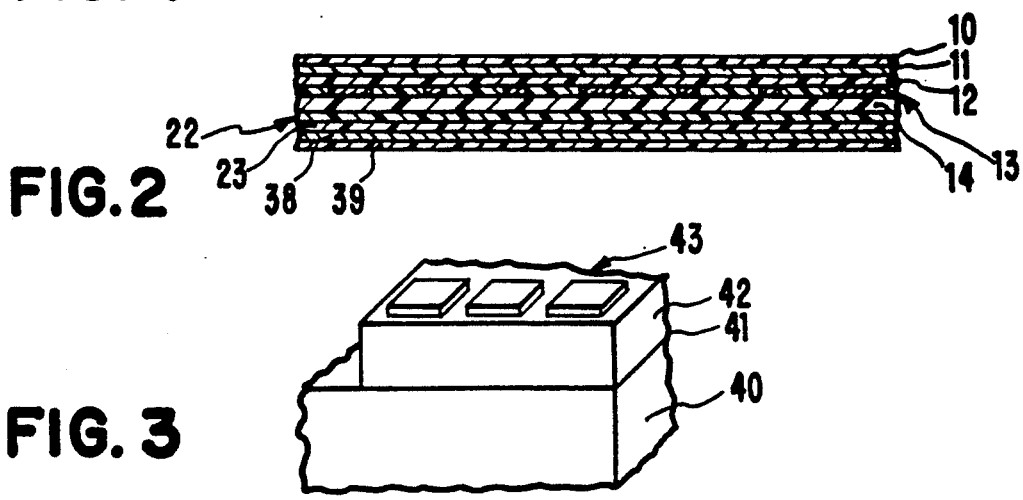
FIG. 2
FIG. 3

POWER AND SIGNAL DISTRIBUTION IN ELECTRONIC PACKAGING

DESCRIPTION

1. Field of the Invention

The invention relates generally to the packaging of electronic, principally semiconductor, apparatus and in particular to the distribution of power and signal conductors carrying multiple power supply levels through such apparatus.

2. Background of the Invention and Related to the Prior Art

In the packaging of electronic apparatus, the active signal translating elements, principally semiconductors, are positioned for accessibility and heat transfer and are supported by an overall interconnecting wiring structure. When improvements are made in the active elements, such as semiconductor chips, changes become necessary in the wiring structure usually in optimizing relative positioning and signal transmission properties to in turn maximize the benefits of the improvement. The wiring structure at the present state of the art, with high density and signal processing complexity, is the product of extensive automated design and is a substantial investment. Changes to the wiring structure are difficult and expensive so that it is desirable to retain it through as many active device or chip improvements and rearrangements as practical.

The higher performance wiring structures in the art are generally superimposed orthogonal -x- and -y- direction wiring planes of parallel impedance controlled conductors where each plane is electrically referenced to a ground plane between wiring planes and interconnections are made through periodically positioned vertical or -z- direction conductors called vias. This type of wiring structure is shown in U.S. Pat. No. 4,685,033. In such a wiring structure, improvements that involve a need in the active devices for additional power levels are difficult to accommodate without major rearrangement of the wiring.

There have been efforts in the art to address some of the limitations in the technology.

Intermediate wiring packages are employed for localized wiring accommodation between an overall wiring structure and a subset of the active devices or chips.

An intermediate interconnecting member is shown in U.S. Pat. No. 4,859,806 wherein separate -x- and -y- direction conductor planes are positioned with ground planes above and below interconnected with -z- direction vias.

Thin Film Modular (TFM) wiring packaging involving small area very fine conductor widths and thin dielectric materials produced by deposition techniques is shown in U.S. Pat. No. 4,855,537 using a ground plane of mesh or grid shape with width of the mesh members varied for signal propagation benefits.

Cross talk between signal wires is reduced using a ground grid or mesh with the signal wires going through openings in the mesh in DE2909167.

Distribution techniques are employed within semiconductor type base substrates.

In U.S. Pat. No. 4,866,507 power and signal lines are in one plane.

In U.S. Pat. No. 4,847,732 lines can be electrically programmed in a semiconductor wafer substrate.

There remains however a need in the art, as the performance specifications become more stringent, for better control of signal propagation, cross talk, and power distribution in electronic wiring structures.

SUMMARY OF THE INVENTION

A controlled impedance signal and power distribution network is provided in which on each -x- and -y- direction plane of dielectric supported conductors, power and signal conductors are adjacently positioned and each of the -x- and -y- direction conductor planes has a ground plane coextensive therewith separated by a uniform dielectric thickness. Via connections in the -z- direction are used to join all power conductors on all conductor planes for a particular power level and all signal conductors referenced to a particular power level.

The resulting network of the invention provides a conductor distribution mesh or grid wherein each signal conductor is uniformly positioned from both ground and from a respective power conductor throughout the entire network. Multiple power levels can be distributed.

The invention is of particular advantage in thin film modular (TFM) wiring technology wherein multiple power levels can be distributed with fewer layers.

BRIEF DESCRIPTION OF THE DRAWINGS

FIG. 2 is a schematic illustration of a side view of a wiring module of the thin film type.

FIG. 3 is an illustration of a thin film type wiring module mounted on a wiring structure.

FIG. 4 is a composite graph showing the tradeoff in wireability and DC voltage drop with size and spacing.

DESCRIPTION OF THE INVENTION

Figure 1:
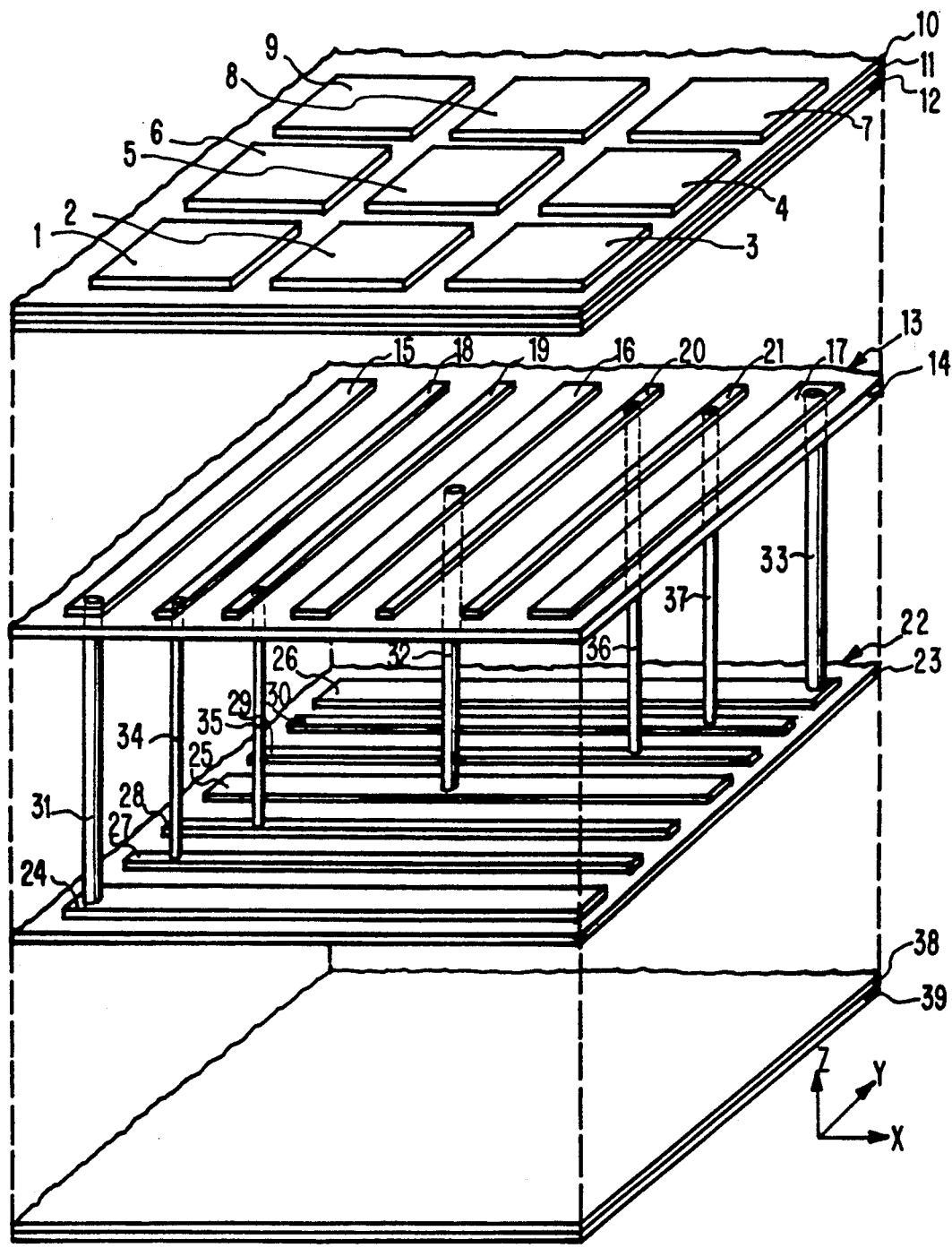
FIG. 1 is a schematic illustration of a wiring module illustrating the principles of the invention.

In a wiring package in which large numbers of interwiring members in -x- and -y- direction planes that are interconnected by -z- direction interplanar connector or via members, form a signal and power network for the active devices in the package, in accordance with the invention, a power and signal distribution network can be constructed where each signal conductor is electrically referenced uniformly along its length to both its power conductor and ground. The network of the invention is achieved by providing adjacently positioned power and signal conductors on each x and y direction plane separated by a uniform thickness of dielectric from ground with the conductors for each level of power being joined by via connections and the signal conductors adjacent each different level of power conductor on each plane being joined by via connections. The network of the invention is a mesh or grid throughout the package that provides benefits in enhancing signal propagation while minimizing cross talk between signal conductors and power distribution noise.

In FIG. 1 the principles of the invention are illustrated in a pictorial schematic assembly of a portion of a wiring structure showing the essential parts. Referring to FIG. 1, a plurality of active elements, such as semiconductor chips 1-9, are positioned for accessibility and heat dissipation on an insulating surface 10 having connection locations or contact pads therein, not shown, to which connecting elements on the underside of the active elements 1-9 are bonded in the manner of the flip chip technique, also not shown, but which is an extensively practiced technology in the art.

A ground plane 11 is shown as a separate layer under the insulating layer 10 for illustration clarity. In practice, such ground plane layers are frequently metallized coatings on an adjacent dielectric layer. The ground plane 11 is separated from a plane of parallel conductors 5 by a dielectric member 12.

In the illustration of FIG. 1, there is a difference in scale between the portion illustrating the active elements 1-9 and the remaining portion. The scale of the remaining portion is expanded to show the relative conductor supporting, positioning and interconnecting principles. For perspective, in the active element section, the three elements 1, 2 and 3 would occupy about a 54 millimeter linear dimension whereas in the conductor section power conductors are about 5 microns wide, signal conductors are about 1 micron wide and the separation between conductors is about 2-5 microns. The -z- direction interconnecting vias are about 2 mils in diameter and about 10 mils apart. The distribution mesh and grid that is illustrated would fit between the usual via periodicity that provides contacts to the active devices.

The plane of parallel conductors, 13, to be considered to be in the -y- direction for identification is supported on a dielectric layer 14 of approximately the same thickness as the dielectric layer 12. In the -y- direction plane of conductors 13, power carrying conductors 15, 16 and 17 and signal carrying conductors 18, 19, 20 and 21 are illustrated. The relationship of the signal conductors and power conductors is such that every signal conductor is adjacent and electrically referenced to the power conductor supplying the circuit of which it is a part. Signal conductor 18 is adjacent and electrically referenced to power conductor 15, signal conductor 21 is adjacent and electrically referenced to power conductor 17 and signal conductors 19 and 20 are adjacent on opposite sides and are electrically referenced to power conductor 16. There can be as many power conductors as useful in the available space. There can be two signal conductors, such as 20 and 21 between power conductors. Generally, the power conductors are wider because current carrying requirements vary over a larger range than signal conductors.

The plane of parallel conductors 22, to be considered to be in the -x- direction for identification, is supported on a dielectric layer 23 of approximately the same thickness as dielectric layers 12 and 14. In the -x- direction plane of conductors 22, power carrying conductors 24, 25 and 26, and signal carrying conductors 27, 28, 29 and 30 are illustrated. The relationship of signal conductors to power conductors in the -x- plane 22 is the same as that in the -y- plane 13 in which every signal conductor is adjacent and electrically referenced to the power conductor supplying the circuit of which it is a part. Signal conductor 27 is adjacent and electrically referenced to power conductor 24, signal conductor 30 is adjacent and electrically referenced to power conductor 26 and signal conductors 28 and 29 are adjacent on opposite sides and are electrically referenced to power conductor 25. There can be as many power conductors as useful in the available space. There can be two signal conductors such as 27 and 28 between power conductors. Generally, the power conductors are physically wider than the signal carrying conductors.

The mesh or grid of power and signal conductors are interconnected through -z- direction interconnections or vias that go through the planes of the wiring structure. In FIG. 1 the -z- direction vias to illustrate the mesh or grid requirements of the invention are shown as elements 31-37. Since the distance for illustration purposes is expanded, the vias appear longer whereas in fact from the -x- plane 22 to the -y- plane 13 they are only as long as the thickness of the dielectric layer 14.

In FIG. 1, for clarity, only one via to illustrate the electrical interconnection of the mesh or grid is shown. In general, vias are liberally used at locations where conductors are superpositioned to minimize the effect of imperfections in conductors and to facilitate parallelism in circuits. The x and y conductors for each level of power in the grid or mesh are connected. Conductors 15 and 24 are a first power level and are connected by via 31. Conductors 16 and 25 are a second power level and are connected by via 32. Conductors 17 and 26 are a third power level and are connected by via 33. Similarly, the corresponding signal conductors are interconnected by vias. Signal conductor 27 electrically referenced to power conductor 24 is connected by via 34 to signal conductor 18. Signal conductor 28 is connected by via 35 to signal conductor 19. Signal conductor 29 is connected by via 36 to signal conductor 20. Signal conductor 30 is connected by via 37 to signal conductor 21.

A ground plane 38 is in contact with the side of the dielectric layer 23 opposite to the side supporting the -x- plane 22 of conductors.

A layer 39 of dielectric is provided to isolate the assembly from further packaging.

In manufacture, the dielectric is usually a layer or lamination of uncured or green sheet material or a layer of deposited material on which conductors are deposited. The layers are assembled in a stack and may be cured into a unitary structure in which the layers may lose their individuality but the layer thicknesses separate the conductor planes and ground planes in the completed structure. The term layer is also used for a lamination of dielectric material.

While for illustration purposes one assembly of a single pair of -x- and -y- conductor planes 22 and 13, each with a ground plane 30 and 11, are shown, it will be apparent that the power and signal distribution mesh or grid of the invention can be extended both horizontally throughout the wiring structure and vertically in as many x and y directions with above and below ground plane assemblies as desired. Each assembly contains a power and signal distribution mesh or grid where multiple power levels referenced to ground along the entire length are available on each direction plane, and all signal conductors are referenced along the length to both ground and the respective power level.

PREFERRED EMBODIMENT OF THE INVENTION

The invention is of particular benefit in the thin film modular (TFM) type wiring in which the number of layers is limited by constraints inherent in the processing so that the addition of power and signal distribution complexity as may occur where there is an improvement in chip performance is more difficult than in other technologies.

The thin film modular (TFM) wiring structure is an intermediate wiring member that is positioned between the wiring structure and a chip or a subset of the chips to achieve a localized wiring accommodation. They are flexible. They rest on the wiring structure and support the chips.

They are produced by deposition and coating techniques that result in laminar structures of insulating layers of about 15 microns thick with signal conductors of about 5 microns in width and thickness. Such deposition and coating manufacturing techniques, while flexible and relatively inexpensive, do limit the number of signal and power layers that can be provided. There are typically two signal and two power levels in a TFM that supplies several chips. The fine conductor size accommodates signal requirements very well but the limit on the number of layers can cause power and reference potential distribution problems where more than one voltage level is required by the chips mounted on the TFM.

The limitation in the TFM of difficulty in extending the availability of additional power and ground distribution becomes even more difficult to surmount where it becomes necessary to separately power one or more chips or processing groupings from the same supply as may be done, for example, to isolate power supply noise.

Another limitation encountered in using the deposition type TFM technology is the presence of breaks in power lines which can raise the inductance of the power supply network and introduce impedance discontinuities in signal lines that cross such breaks.

In accordance with the invention, when both power and signal conductors are interpositioned on each -x- and -y- direction layer in a TFM, fewer layers are needed since separate power layers are not used. As may be seen from FIG. 1, two vertically stacked assemblies of above and below ground layers 11 and 38, with -x- 22 and -y- 13 direction conductor planes on insulating layers 23 and 14, respectively, can be assembled in approximately the same number of layers as a TFM with the conventional two layers -x- and -y- of signal conductors and two layers of power conductors.

In addition to added wiring flexibility and capacity, the invention also provides strict impedance control throughout the distribution network by the fact that every power and signal line is electrically referenced to ground through a uniform thickness of dielectric throughout its length and every signal line is electrically referenced throughout its length to both ground through a uniform dielectric thickness and to its respective power level by a uniform proximity in placing.

Throughout the wiring substrate regardless of where wires are placed, as a result of this invention the guaranteed uniform proximity to both ground plane and respective power conductor, increases the self capacitance of the signal line and therefore reduces the ratio of signal line to signal line coupling capacitance to self capacitance, which ratio is proportional to the cross talk between signal lines.

In a preferred embodiment of the invention, the power conductors are about 15-65 microns wide, the signal conductors about 10-15 microns wide, both with a thickness of about 1-5 microns, with a spacing between power and signal conductors of from 5-25 microns, and with a dielectric thickness of about 15 microns.

Referring to FIG. 2, a schematic side view of a portion of a TFM is provided illustrating the layers and using the same reference numerals as FIG. 1. The external insulating layers 10 and 39 would be common in vertically stacked assemblies. In view of the fact that the deposition technology used in TFM manufacturing does not generally include the planarization of the upper surface after a plane of conductors is deposited, the conformal ability of the dielectric layers tends to limit the number of assemblies of layers that can be stacked. Planarization relaxes this limitation but at the expense of adding a step.

Referring to FIG. 3, a schematic view is provided of a TFM resting on a wiring structure. In FIG. 3, the wiring structure 40 is usually an integral element in which multiple planes of conductors separated by insulation are interconnected by vias in a periodic pattern that are brought to the surface 41 usually in the configuration of nearly flush pads for interconnection to chips or other circuitry. The TFM 42 of the invention is positioned on the surface 41 of the wiring structure 40 with the subset illustrated as three chips 43 thereon. The periodic pattern of vias used in the wiring structure 40, not shown, would be carried vertically through the TFM 42 to the contacts on the underside, not shown, of the chips 43. The TFM 42 of the invention provides the ability to accommodate added voltage and signal requirements in new chips 43 without having to change the wiring structure 40 each time added chip capability occurs.

The power and signal distribution network of the invention permits high wiring density while retaining flexibility in interconnecting and without an excessive increase in resistance. Since the conductors are all uniformly electrically referenced throughout their length, cross talk, that is a situation where a signal on one line induces noise in another, is minimized.

Referring to FIG. 4, a composite graph is shown illustrating the tradeoff in wireability and DC voltage drop with spacing, using as an example a network where the power conductors are about 5 microns thick and 25 microns wide, the signal conductors are about 5 microns high and 13 microns wide and the spacing varies from about 6 to 24 microns. The relative sizes and spacing are depicted in the center of the graph. The symbols for the points on the curves representing the different spacing distances are shown in the legend at the top of the graph. The figure of merit (FOM) for wireability is a measure of how densely a given area can be wired. It is a measure of inches of wiring per square inch of substrate. The curves show the fall off as the power conductors get wider.

The resistance figure of merit (FOM) is a dimensionless quantity that is a measure of the direct current carrying capacity of the mesh. As the power conductors are made wider, the current carrying capacity increases.

The optimum mesh design for a given set of conditions is a tradeoff between the two.

What has been described is a controlled impedance packaging network wherein assemblies are made up of -x- and -y- direction planes of interpositioned power and signal conductors with a dielectric layer between planes and separating each plane from a ground plane. The network provides the ability to distribute many power levels with all power and signal conductors electrically referenced to ground along their length and each signal conductor is electrically referenced to its power level along its length.

Having thus described our invention, what we claim as new and desire to secure by Letters Patent is:

1. An integrated circuit packaging substrate comprising:
   a plurality of dielectric layers,
   electric conductor planes disposed between adjacent dielectric layers, each said electric conductor plane electrically referenced to a ground plane through a dielectric layer, and, each of said electric conductor planes having at least two power conductors and at least one signal conductor.

2. The substrate of claim 1 including a power conductor adjacent each signal conductor.

3. The substrate of claim 2 wherein each said power conductor is 1–5 microns thick and 15–65 microns wide, each said signal conductor is 1–5 microns thick and 10 to 15 microns wide with spacing between power and signal conductors of 5 to 25 microns and with a dielectric layer thickness of about 15 microns.

4. In an electronic wiring interconnecting substrate wherein there are superimposed layers of dielectric material supporting planes of conductors and ground, the controlled impedance conductor network improvement comprising:

at least one assembly of a first ground layer, a first layer of dielectric material with a first surface thereof in contact with said first ground layer, a first plane of parallel power and signal conductors in the -x- identification direction, in contact with the second and opposite surface of said first layer of dielectric material, and wherein said first plane of parallel conductors includes a plurality of at least first and second power conductors, each of said power conductors having adjacent thereto at least one signal conductor electrically referenced to said adjacent power conductor, a second layer of dielectric material having a first surface in contact with the conductors of said first plane of conductors, a second plane of power and signal conductors in the -y- identification direction in contact with the second and opposite surface of said second layer of dielectric material, and wherein said second plane of parallel conductors includes a plurality of at least first and second power conductors, each of said power conductors having adjacent thereto at least one signal conductor electrically referenced to said adjacent power conductor, a third layer of dielectric material having a first surface in contact with the conductors of said second plane of conductors, and a second ground layer in contact with the second and opposite surface of said third layer of dielectric material.

5. The wiring improvement of claim 4 including said assembly positioned on a wiring substrate and supporting at least one active device.

6. The wiring improvement of claim 5 wherein each said power conductor is 1–5 microns thick and 5–65 microns wide, each said signal conductor is 1–5 microns thick and 10–15 microns wide with spacing between power and signal conductors of 5 to 25 microns and with a dielectric layer thickness of about 15 microns.

7. In an electronic wiring substrate of parallel layers of conductor planes and ground planes, a controlled impedance power and signal distribution grid improvement comprising:

each plane of conductors having at least two power levels with parallel power conductors, each power conductor having adjacent thereto a signal conductor electrically referenced to said adjacent power conductor, each plane of conductors being referenced through one dielectric thickness to a ground plane and via interconnections joining the power conductors of each power level on each conductor plane and via interconnections joining the signal conductors on each conductor plane referenced to the corresponding power level.

8. The power and signal grid improvement of claim 7 wherein said layers of dielectric material, conductor planes and ground planes are assembled in a thin film modular structure positioned on a wiring structure and supporting at least one active device.

9. The power and signal grid improvement of claim 8 wherein each said power conductor is 1–5 microns thick and 5–65 microns wide, each said signal conductor is 1–5 microns thick and 10–15 microns wide with spacing between power and signal conductors of 5 to 25 microns and with a dielectric layer thickness of about 15 microns.

10. An electronic wiring interconnecting substrate of superimposed dielectric layers supporting and separating planes of conductors and ground comprising:

at least one of said planes of conductors including at least two power levels with parallel power conductors, each with at least one adjacent signal conductor, and a ground plane separated from said plane of conductors by a dielectric layer.

11. In electronic packaging of the type wherein wiring in a supporting structure provides power and signal interconnection for active signal translating elements on said supporting structure, the improvement comprising:

a signal and power distribution network in said wiring structure wherein each power conductor is electrically referenced to ground through a single dielectric thickness and each signal conductor is electrically referenced both by adjacent positioning to a power conductor supplying it and through a single dielectric thickness to ground.

12. The electronic packaging improvement of claim 11 wherein said signal and power distribution network is in a thin film module structure positioned on a wiring substrate and supporting semiconductor chips.

13. The electronic packaging improvement of claim 12 wherein each said power conductor is 1–5 microns thick and 5–65 microns wide, each said signal conductor is 1–5 microns thick and 10–15 microns wide with spacing between power and signal conductors of 5 to 25 microns and with a dielectric layer thickness of about 15 microns.

* * * * *